United States Patent
Hartogs et al.

(10) Patent No.: US 6,706,326 B1
(45) Date of Patent: Mar. 16, 2004

(54) PROCESS FOR PLATING PLASTICS USING A CATALYTIC FILLER

(75) Inventors: Matty J. Hartogs, Rosmalen (NL); Jan J. M. Hendriks, Sint Oedenrode (NL); Joachim Heyer, Neun Kirchen (DE); Uwe Pingler, Solingen (DE)

(73) Assignee: Enthone Inc., New Haven, CT (US)

(*) Notice: Subject to any disclaimer, the term of this patent is extended or adjusted under 35 U.S.C. 154(b) by 0 days.

(21) Appl. No.: 09/673,832

(22) PCT Filed: Jul. 12, 2000

(86) PCT No.: PCT/US00/16324

§ 371 (c)(1),
(2), (4) Date: Sep. 1, 2000

(87) PCT Pub. No.: WO01/05518

PCT Pub. Date: Jan. 25, 2001

(30) Foreign Application Priority Data

Jul. 16, 1999 (EP) .............................................. 99202376

(51) Int. Cl.$^7$ ........................... B05D 3/10; B29C 59/00; C08J 5/00; C08J 7/04
(52) U.S. Cl. ........................ 427/306; 427/307; 427/322; 427/443.1; 264/129; 264/330; 264/338
(58) Field of Search .......................... 427/98, 306, 307, 427/322, 443.1; 264/129, 328.1, 330, 337, 338, 331.11

(56) References Cited

U.S. PATENT DOCUMENTS

| | | | | | |
|---|---|---|---|---|---|
| 4,281,038 A | * | 7/1981 | Ambros et al. | ............. | 428/131 |
| 4,601,783 A | * | 7/1986 | Krulik | ......................... | 156/655 |
| 4,767,665 A | * | 8/1988 | Seeger | ......................... | 428/328 |
| 5,139,818 A | * | 8/1992 | Mance | ......................... | 427/585 |
| 5,739,193 A | * | 4/1998 | Walpita et al. | ............. | 524/413 |

FOREIGN PATENT DOCUMENTS

| | | |
|---|---|---|
| GB | 979779 | 1/1965 |
| GB | 979779 A * | 1/1965 |

* cited by examiner

*Primary Examiner*—Michael Barr
(74) *Attorney, Agent, or Firm*—Senniger, Powers, Leavitt & Roedel

(57) ABSTRACT

A process for the deposition of a metal on surfaces of a shaped plastic body. A catalyst for metal deposition is incorporated into a shaped body. After removing material from a surface of the body and activating the catalyst with an acid, metal is deposited on the surface by an electroless metal deposition process.

15 Claims, No Drawings

PROCESS FOR PLATING PLASTICS USING A CATALYTIC FILLER

BACKGROUND OF THE INVENTION

The present invention relates to an improved process for plating plastics using a catalytic filler. More specifically, the present invention relates to electroless plating.

There is a growing need for plating non electrically conductive plastic surfaces with metals for application in e.g. circuit boards, shields for electromagnetic radiation in electronic devices, etc.

To obtain the desired metal plating of plastics, electroless plating using a catalytic material which is present on the surface of the article to be plated can be applied. The catalyst usually comprises $PdCl_2$, silver compounds or ferrous phosphides, which are present in the form of small particles on the surface of the article to be plated. In order to deposit the metal, the article is submerged in a solution of a salt of the desired metal and an appropriate reducing agent. Under suitable conditions the catalyst particles cause the metal ions to be reduced from the solution to form a metal plating. This step can be followed by one or more additional electroless plating steps, using additional solutions or by conventional electrochemical plating steps. In this way a plating of the desired thickness can be obtained.

A common technique to apply the catalyst material to the surface of the article is by using a lacquer in which the catalyst material is present. Usually such a lacquer comprises acrylic resins, polyurethane (PUR) (crosslinked or non-crosslinked) resins, and the like. After applying the liquid lacquer to the article, it is heated, which causes the solvent to evaporate and, subsequently, the resin to harden. This type of plating proves effective for plating acrylonitrile-butadiene-styrene copolymer (ABS), polycarbonate (PC) blends, PC and others.

Another technique to apply the catalyst material, which technique generally uses Pd salts, is to dip the pretreated plastic parts in a palladium based activator solution. After the proper pretreatment the catalyst will absorb onto the polymer surface.

An obvious drawback of the first mentioned technique is that it is difficult or even impossible to plate articles with surfaces that are not easily accessible for the lacquer. For example, drill holes in printed circuit boards or articles having a complex geometry cannot be coated successfully with a lacquer filled with catalyst. Selective plating can only be achieved by using masking techniques when applying the lacquer. The second technique, which uses immersion in catalyst solution, does not provide any selectivity at all.

Another disadvantage is the requirement that adhesion of the lacquer has to be sufficiently strong. This cannot be achieved for all types of polymer. For example, liquid crystal polymers like Vectra® E 820 I and polymers like poly(butylene terephthalate) (PBT), polyethylene (PE), polypropylene (PP) or nylon cannot be successfully plated using a lacquer filled with catalyst.

An alternative approach for the metal plating of plastic articles is the mixing in the bulk of the plastic of the article to be plated, followed by the above mentioned electroless plating step, optionally followed by another electroless or an electrochemical plating step.

U.S. Pat. No. 4,767,665 discloses an electroless plating process for plastic materials. The plastic articles described in this patent are prepared by compounding metallic phosphide compounds in the plastic article.

According to U.S. Pat. No. 4,767,665 the metallic particles are exposed by carrying out a surface treatment, such as a mechanical or thermal treatment. This is then followed by plating by means of the above mentioned electroless process, e.g. by placing the articles in baths of copper salt solutions in case a copper plating is desired.

The method disclosed in U.S. Pat. No. 4,767,665 does not solve the above-mentioned problem of plating surfaces of complex shaped articles.

Plating surfaces of complex shaped articles is of particular relevance in plating moulded interconnected devices in which often complex structures appear, which in addition require selective plating. It is also relevant for through hole copper plating of printed circuit boards.

Moreover, all of the known processes for plating plastics using catalytic fillers have in common that the initiation process of electroless plating is slow. This is reflected in the period of time that is required to observe the first signs of metal deposits. Usually this is 20 minutes or more.

In addition, with known plating techniques the means of achieving selectivity for the metal to deposit on the treated regions of the surface are limited, resulting in a final product with an insufficient resolution, unless laborious phototechniques are used. This is especially of importance in the production of printed circuit boards and moulded interconnected devices.

SUMMARY OF THE INVENTION

The present inventors have found that when the surface treatment required to expose the catalytic particles is performed using an alkaline solution, and this is followed by an activation of the exposed particles by a treatment with acid, the problems mentioned above can be overcome.

According to the present invention a plating process is provided comprising the following steps:
 a) compounding a granular plastic with a catalyst suitable for an electroless plating reaction, optionally with one or more fillers,
 b) forming a shaped body from the product of step a),
 c) removal of at least part of the material from the surface of the product of step b) to expose part of said catalyst,
 d) treatment with an acid to activate the exposed catalyst of step c), and
 e) metal plating of the product of step d) in an electroless metal bath.

To form moulded interconnected devices, second and further moulding steps using a non-filled plastic may be carried out between steps b) and c), providing selectivity.

Using the process according to the invention, a plating rate of about 2 $\mu$m/h or higher can be obtained. In addition, the time in which initial deposition of metal is observed is less than about 15 minutes, and sometimes even less than about 10 minutes.

It is also possible to obtain a good and selective plating on complex shaped articles.

DETAILED DESCRIPTION OF THE PREFERRED EMBODIMENT

According to the present invention the removal of the plastic in step c) is preferably carried out by dissolving the plastic using an alkaline solution. Alternatively any other suitable removal technique can be used.

Suitable plastics that can be used for the plating process according to the invention are polymers which are known to be attacked by alkaline solutions. When treating such plastics with strong alkaline materials such as sodium hydroxide, the catalyst particles incorporated therein are partly set free. If such a treated material is brought in an electroless plating bath a better initiation is obtained, and the copper adheres better to the plastic. Preferred are liquid crystal polymers (LCP), such as Vectra® E 820 I, A 530, C 810, or other liquid crystal polymers sold under the registered trade names Ekkcel, Xydar and Utrax, which are all based on long chain macromolecules of acrylate copolymers comprising reinfacing groups such as p-hydroxy benzoate or 2,6-naphthalene diacids or -diols; etc., or a polymer chosen from the group consisting of ABS, ABS/PC, poly(ethylene imine) (PEI), polystyrene (PS), polyethyl-ether-ketone (PEK), polyether sulphone (PES), rubbers, nylon, poly (ethylene terephthalate) (PET) poly(butylene terephthalate), or blends like PC/LCP or PBT/PC. Particularly preferred are PBT, PC, LCP and alkaline etchable nylons.

In step (a) the granular plastic is compounded with a catalyst. In this step fillers optionally may be present. Suitable fillers are glass particles, dolomite, graphite, phosphates, sulfates, or more in detail, sulphates, phosphates and carbonates of potassium, barium and/or calcium. Fillers are added to improve mechanical strength, for coloring, as flame retardant, as "etchable" component or just as a cheap bulk material to lower the price of the material to be made.

Following the exposure step, the acid treatment is performed to activate the exposed particles. Acids that are suitable for this purpose are chosen from the group consisting of solutions of strong mineral and/or organic acids with a pH of below 2, preferably <1. Acids which can suitably be used in step (d) are sulphuric acid, hyrochloric acid, methane sulphonic acid, sulphamic acid, acetic acid, glycine, phosphoric acid, oxalic acid, naphthalene sulphonic acid, maleic acid, benzene sulphonic acid, trichloro acetic acid and chromic acid.

The catalyst material which is present in the plastic comprises phosphides, preferably ferrous phosphides, optionally mixed with other catalytic compounds, such as silver compounds, for example $AgNO_3$ or organo silver compounds; palladium compounds or metals such as palladium, nickel, silver or mixtures thereof.

In a preferred embodiment, the forming of a shaped body in step b) is carried out by injection moulding.

The invention will now be illustrated with examples, which are not intended to limit the scope of the invention.

EXAMPLE 1

Samples of Vectra® E 820 I were compounded with ferrous phosphide in an amount of 15 weight-%, drawn on the total composition, using a screw extruder. The samples were subsequently etched using a sodium hydroxide solution of ca. 10 N, at 70° C., 15 minutes followed by activation at room temperature using sulphuric acid of ca. 6% for 1 minute.

The samples where submerged in a chemical copper bath (Enplate™ Cu 872 I/873) at 46° C. and the plating rate was monitored.

After 5 minutes the first sign of copper deposition was observed. After 12 minutes a closed, viz. continuous metal layer was observed.

The plating rate was 2–2.5 μm/h and the final copper thickness was 20 μm.

The plated samples were subjected to the ASTM 3359-83-B, tape test, wherein the binding between the plated metal layer and the substrate layer is evaluated. From this test, it becomes clear that the binding is good (grade 4 to 5 on a scale of 0 to 5).

EXAMPLE 2

Samples of Vecta® E 820 I filled with ferrous phosphide where prepared as in the previous example. This material was formed into plates, in which plates holes of different length and diameter were drilled. The holes where wider than 0.15 mm. Part of the holes were etched with 10 N sodium hydroxide. Part of the holes from the etched portion were treated with sulphuric acid 2.5%.

The following results were obtained:

| Holes | Time to first sign of copper [minutes] | Plating rate [μm/h] |
| --- | --- | --- |
| non treated | ∞ | 0 |
| only etched | ≧15*) | 2**) |
| etched and acid treated | 5 | 2 |

*): Depending on time between etching and plating.
**): Once the initiation is complete.

What is claimed is:

1. A process for electroless plating of plastics comprising the steps of:
   a) compounding a granular plastic with a catalyst suitable for an electroless plating reaction, said catalyst comprising a metal phosphide,
   b) forming a shaped body from the product of step a),
   c) removing at least part of the material from a surface of the shaped body of step b) to expose part of the catalyst,
   d) treating the shaped body with an acid solution to activate the exposed catalyst of step c), and
   e) metal plating the product of step d) in an electroless metal bath.

2. The process according to claim 1 wherein the metal phosphide is a ferrous phosphide.

3. The process according to claim 1 wherein the removal of material from the shaped body is carried out by contacting the shaped body with an alkaline solution.

4. The process according to claim 1 wherein the acid solution comprises an acid selected from the group consisting of sulphuric acid, hydrochloric acid, methane sulphonic acid, sulphamic acid, acetic acid, glycine, phosphoric acid, oxalic acid, naphthalene sulphonic acid, maleic acid, benzene sulphonic acid, trichloro acetic acid, and chromic acid.

5. The process according to claim 4 wherein the acid is sulphuric acid.

6. The process according to claim 1 wherein the acid solution has a pH of less than about 2.

7. The process according to claim 1 wherein the acid solution has a pH of less than about 1.

8. The process according to claim 1 wherein metal is plated on the shaped body at a rate of at least about 2 micrometers per hour.

9. The process according to claim 1 wherein the shaped body is plated with a metal selected from the group consisting of copper, nickel, silver, cobalt, gold, palladium, tin, and mixtures thereof.

10. The process according to claim 1 wherein metal is observed to initially deposit on the shaped body in the electroless metal bath in less than about 15 minutes.

11. The process according to claim 1 wherein metal is observed to initially deposit on the shaped body in the electroless metal bath in less than about 10 minutes.

12. The process according to claim 1 wherein metal is observed to initially deposit on the shaped body in the electroless metal bath in less than about 5 minutes.

13. A process for electroless plating of plastics comprising the steps of:
   a) compounding a granular plastic with a metal phosphide catalyst suitable for an electroless plating reaction,
   b) forming a shaped body from the product of step a),
   c) contacting the shaped body of step b) with an alkaline solution to remove at least part of the material from a surface of said shaped body to expose part of the catalyst,
   d) treating the shaped body with an acid solution to activate the exposed catalyst of step c), and
   e) metal plating the product of step d) in an electroless metal bath.

14. A process for electroless plating of plastics comprising the steps of:
   a) compounding a granular plastic with a ferrous phosphide catalyst suitable for an electroless plating reaction,
   b) forming a shaped body from the product of step a),
   c) contacting the shaped body of step b) with an alkaline solution to remove at least part of the material from a surface of said shared body to expose part of the catalyst,
   d) treating the shaped body with an acid solution to activate the exposed catalyst of step c), and
   e) metal plating the product of step d) in an electroless metal bath.

15. A process for electroless plating of plastics comprising the steps of:
   a) compounding a granular plastic with a catalyst suitable for an electroless plating reaction, said catalyst comprising a ferrous phosphide,
   b) forming a shaped body from the product of step a),
   c) contacting the shaped body of step b) with a sodium hydroxide solution to remove at least part of the material from a surface of said shaped body to expose part of the catalyst,
   d) treating the shaped body with a sulphuric acid solution having a pH of less than about 2 to activate the exposed catalyst of step c), and
   e) copper plating the product of step d) in an electroless metal bath to form an initial copper deposition on the shaped body in less than about 20 minutes and continuing copper plating to a thickness of at least about 20 micrometers, wherein copper is deposited on the shaped body at a rate of at least about 2 micrometers per hour.

* * * * *

UNITED STATES PATENT AND TRADEMARK OFFICE
CERTIFICATE OF CORRECTION

PATENT NO. : 6,706,326 B1 Page 1 of 1
DATED : March 16, 2004
INVENTOR(S) : Matty J. Hartogs et al.

It is certified that error appears in the above-identified patent and that said Letters Patent is hereby corrected as shown below:

Column 5,
Line 26, "shared body" should read -- shaped body --.

Signed and Sealed this

Ninth Day of November, 2004

JON W. DUDAS
*Director of the United States Patent and Trademark Office*